(12) United States Patent
Schwab et al.

(10) Patent No.: US 10,969,684 B2
(45) Date of Patent: *Apr. 6, 2021

(54) PROTECTION AND ENHANCEMENT OF THERMAL BARRIER COATING BY LITHOGRAPHY

(71) Applicant: General Electric Company, Schenectady, NY (US)

(72) Inventors: Lacey Lynn Schwab, Greenville, SC (US); Canan Uslu Hardwicke, Greenville, SC (US)

(73) Assignee: General Electric Company, Schenectady, NY (US)

( * ) Notice: Subject to any disclaimer, the term of this patent is extended or adjusted under 35 U.S.C. 154(b) by 22 days.

This patent is subject to a terminal disclaimer.

(21) Appl. No.: 16/373,701

(22) Filed: Apr. 3, 2019

(65) Prior Publication Data

US 2020/0319552 A1 Oct. 8, 2020

(51) Int. Cl.
*G03F 7/004* (2006.01)
*G03F 7/20* (2006.01)
*G03F 7/09* (2006.01)

(52) U.S. Cl.
CPC ............ *G03F 7/0047* (2013.01); *G03F 7/092* (2013.01); *G03F 7/7085* (2013.01)

(58) Field of Classification Search
CPC ........................................................ G03F 7/26
See application file for complete search history.

(56) References Cited

U.S. PATENT DOCUMENTS

| 5,419,971 | A | 5/1995 | Skelly et al. |
| 5,723,535 | A | 3/1998 | Krismer et al. |
| 5,870,956 | A | 2/1999 | Ghosh |
| 6,846,574 | B2 | 1/2005 | Subramanian |
| 8,357,454 | B2 | 1/2013 | Kulkarni |
| 9,289,917 | B2 | 3/2016 | Bucci et al. |
| 9,808,885 | B2 | 11/2017 | Bruck et al. |
| 2002/0072205 | A1* | 6/2002 | Chang .................. H05K 3/4664 438/496 |
| 2003/0101587 | A1 | 6/2003 | Rigney et al. |

(Continued)

FOREIGN PATENT DOCUMENTS

| DE | 4431723 A1 | 3/1995 |
| WO | 02092872 A2 | 11/2002 |
| WO | 2011085376 A1 | 7/2011 |

OTHER PUBLICATIONS

International Search Report for corresponding International Application No. PCT/US2020/025713 dated Jun. 19, 2020, 11 pages.

(Continued)

*Primary Examiner* — Kathleen Duda
(74) *Attorney, Agent, or Firm* — James Pemrick; Hoffman Warnick LLC (57) ABSTRACT

A method for protecting a coating on a surface of a component is provided. The method includes a coating step for coating at least a portion of the component with a ceramic slurry. A projecting step is used for projecting a pattern of light onto the component with a lithographic process to expose and solidify a ceramic layer. A removing step is used for removing unexposed portions of the ceramic slurry from the component. A heating step heats the component to sinter the ceramic layer. The ceramic layer is formed with multiple fracture planes.

16 Claims, 5 Drawing Sheets

(56) References Cited

U.S. PATENT DOCUMENTS

| | | |
|---|---|---|
| 2004/0115351 A1 | 6/2004 | Lau et al. |
| 2004/0229025 A1* | 11/2004 | Zhang .................. H01C 17/065 |
| | | 428/209 |
| 2008/0131611 A1 | 6/2008 | Hass et al. |
| 2008/0264897 A1 | 10/2008 | Hardwicke et al. |
| 2013/0316476 A1* | 11/2013 | Nam ....................... H01L 33/48 |
| | | 438/26 |
| 2015/0240652 A1 | 8/2015 | Lee et al. |
| 2017/0372820 A1* | 12/2017 | Wozniak .............. H01C 7/1006 |
| 2018/0057414 A1 | 3/2018 | O'Brien et al. |
| 2018/0066527 A1 | 3/2018 | Kadau et al. |

OTHER PUBLICATIONS

International Search Report for corresponding International Application No. PCT/US2020/024412 dated Jun. 5, 2020, 16 pages.

Yang et al., "Ceramic Additive Manufacturing: A Review of Current Status and Challenges," Solid Freeform Fabrication 2017: Proceedings of the 28th Annual International Soild Freeform Fabrication Symposium—An Additive Manufacturing Conference, pp. 652-679.

U.S. Appl. No. 16/373,705, Office Action dated Jul. 6, 2020, 16 pages.

International Search Report for corresponding International Application No. PCT/US2020/025674 dated Jun. 29, 2020, 9 pages.

U.S. Appl. No. 16/373,714 Office Action dated Aug. 20, 2020, 13 pgs.

U.S. Appl. No. 16/373,705, Final Office Action dated Sep. 16, 2020, 14 pages.

U.S. Appl. No. 16/373,714, Final Office Action dated Jan. 7, 2021, 9 pages.

U.S. Appl. No. 16/373,714, Notice of Allowance dated Feb. 3, 2021, 3 pages.

* cited by examiner

PROTECTION AND ENHANCEMENT OF THERMAL BARRIER COATING BY LITHOGRAPHY

BACKGROUND OF THE INVENTION

The present disclosure relates to thermal barrier coatings, and more particularly to lithographically applied layers, patterns, stress elements or sacrificial layers on the thermal barrier coating.

Hot section components of gas turbine engines are often protected by a thermal barrier coating (TBC), which reduces the temperature of the underlying component substrate and thereby prolongs the service life of the component. Ceramic materials and particularly yttria-stabilized zirconia (YSZ) are widely used as TBC materials because of their high temperature capability, low thermal conductivity, and relative ease of deposition by plasma spraying, flame spraying and physical vapor deposition (PVD) techniques. Plasma spraying processes such as air plasma spraying (APS) yield noncolumnar coatings characterized by a degree of inhomogeneity and porosity, and have the advantages of relatively low equipment costs and ease of application. TBC's employed in the highest temperature regions of gas turbine engines are often deposited by PVD, particularly electron-beam PVD (EBPVD), which yields a strain-tolerant columnar grain structure.

To be effective, a TBC should strongly adhere to the component and remain adherent throughout many heating and cooling cycles. The latter requirement is particularly demanding due to the different coefficients of thermal expansion (CTE) between ceramic materials and the substrates they protect, which are typically superalloys, though ceramic matrix composite (CMC) materials are also used. An oxidation-resistant bond coat is often employed to promote adhesion and extend the service life of a TBC, as well as protect the underlying substrate from damage by oxidation and hot corrosion attack. Bond coats used on superalloy substrates are typically in the form of an overlay coating such as MCrAlX (where M is iron, cobalt and/or nickel, and X is yttrium or another rare earth element), or a diffusion aluminide coating. During the deposition of the ceramic TBC and subsequent exposures to high temperatures, such as during engine operation, these bond coats form a tightly adherent and thin alumina ($Al2O3$) layer or scale that adheres the TBC to the bond coat.

The service life of a TBC system is typically limited by a spallation event driven by bond coat oxidation, increased interfacial stresses and the resulting thermal fatigue, or by foreign object damage (FOD). FOD typically occurs during turbine operation and the TBC impacts caused by the foreign objects can, and often, damage the thermal barrier coatings. As the TBC wears away or is knocked off, the performance and lifetime of the turbine components incorporating the TBC may be reduced.

BRIEF DESCRIPTION OF THE INVENTION

According to an aspect of the present disclosure, a method for protecting a coating (e.g., a thermal barrier coating) on a surface of a component is provided. The method includes a coating step for coating at least a portion of the component with a ceramic slurry. A projecting step is used for projecting a pattern of light onto the component with a lithographic process to expose and solidify a ceramic layer. A removing step is used for removing unexposed portions of the ceramic slurry from the component. A heating step heats the component to sinter the ceramic layer. The ceramic layer is formed with multiple fracture planes.

The above, and other objects, features and advantages of the present invention will become apparent from the following description read in conjunction with the accompanying drawings, in which like reference numerals designate the same elements.

BRIEF DESCRIPTION OF THE DRAWINGS

Referring now to the drawings wherein like elements are numbered alike in the several FIGURES.

DETAILED DESCRIPTION OF THE INVENTION

One or more specific aspects/embodiments of the present invention will be described below. In an effort to provide a concise description of these aspects/embodiments, all features of an actual implementation may not be described in the specification. It should be appreciated that in the development of any such actual implementation, as in any engineering or design project, numerous implementation-specific decisions must be made to achieve the developers' specific goals, such as compliance with machine-related, system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," and "the" are intended to mean that there are one or more of the elements. The terms "comprising," "including," and "having" are intended to be inclusive and mean that there may be additional elements other than the listed elements. Any examples of characteristics are not exclusive of other characteristics of the disclosed embodiments. Additionally, it should be understood that references to "one embodiment", "one aspect" or "an embodiment" or "an aspect" of the present invention are not intended to be interpreted as excluding the existence of additional embodiments or aspects that also incorporate the recited features. A turbomachine is defined as a machine that transfers energy between a rotor and a fluid or vice-versa, including but not limited to aircraft engines, gas turbines, steam turbines and compressors.

According to aspects disclosed herein, methods are disclosed that provide improved thermal barrier coatings that include a sacrificial coating to protect against foreign object damage (FOD) and other damage due to erosion. In addition, components may be manufactured with patterned surfaces which reduces or eliminates damage caused by having to machine these surfaces. Thermal barrier coating performance may also be improved by the use of ceramic stress raising elements or anchoring structures, which have increased performance at higher temperatures.

Figure 1:
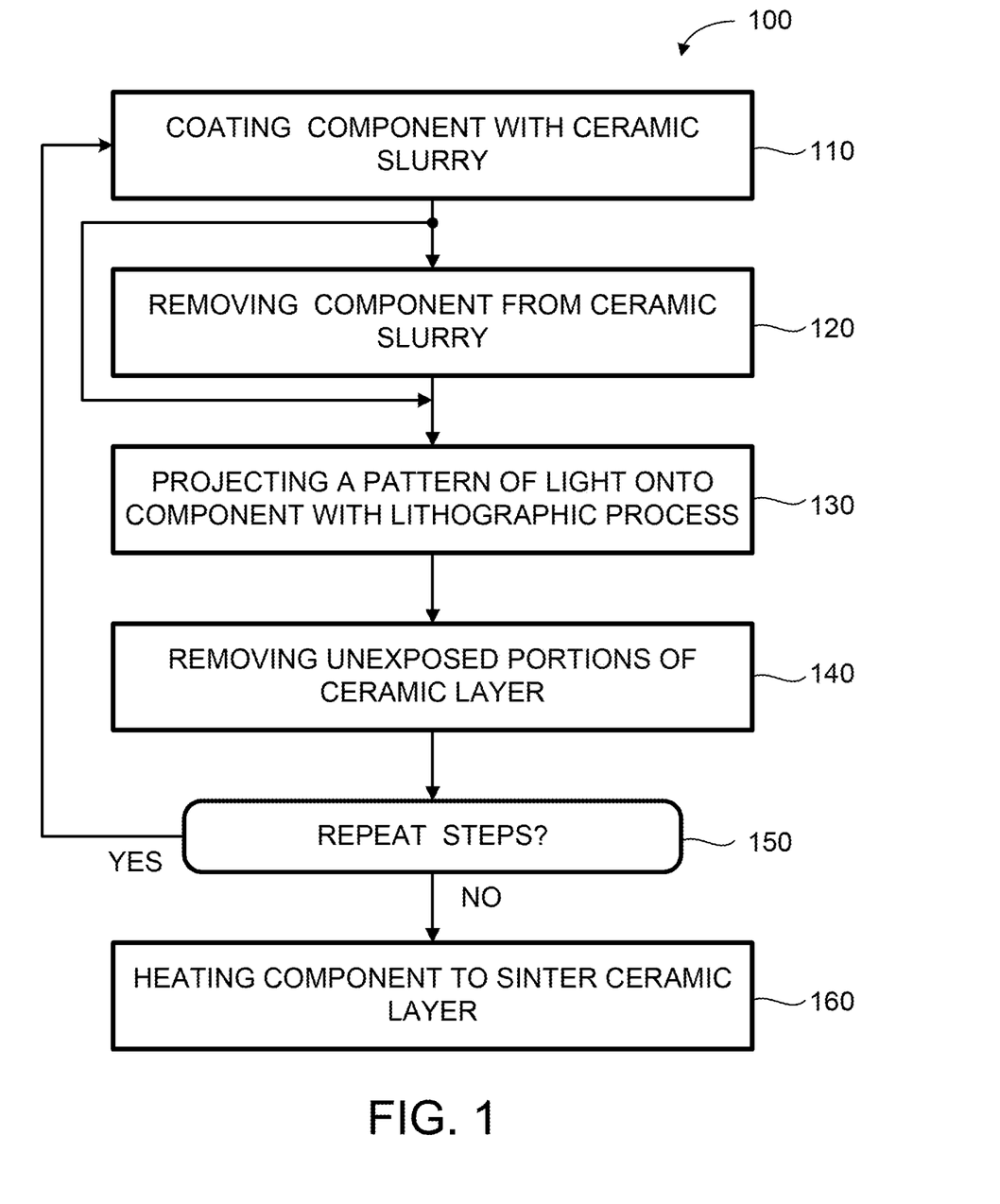
FIG. 1 illustrates a method for enhancing or protecting a thermal barrier coating on a surface of a component, according to an aspect of the present disclosure.

FIG. 1 illustrates a method 100 for enhancing or protecting a thermal barrier coating on a surface of a component, according to an aspect of the present disclosure. The component may be a machine part, a turbomachine part. As non-limiting examples only, the component may be a turbine blade (or bucket), a nozzle, combustor, transition piece, or a turbine shroud, and all these components may be configured for use with a gas turbine. In step 110 the component is coated with a ceramic slurry. For example, all or a portion of the component may be dipped into the ceramic slurry, or the ceramic slurry may be sprayed or brushed onto the component. A doctor blading process may also be used to coat, all or a portion of, the component with ceramic slurry. The ceramic slurry contains a photoreactive polymer. The ceramic slurry may be comprised of alumina ($Al_2O_3$), silicon carbide (SiC), silicon nitride (Si3N4), silica (SiO2), silicate(s), or zirconia, and combinations thereof. The ceramic slurry may be mixed with one or more of a binder, a plasticizer and a dispersant. The ceramic slurry coats the surface of the component.

In optional step 120, the component is removed from the ceramic slurry. The portions of the component that were contacted with the ceramic slurry will now be coated with the ceramic slurry. The component is now transported to a lithographic machine. The terms "lithography" or "lithographic" are defined to include photolithography, optical lithography and/or ultraviolet lithography, and generally refers to a process that uses light to transfer a geometric pattern from a mask to a light-sensitive resist or slurry on the substrate or base material. Alternatively, the component could be sprayed with the ceramic slurry by a robotic system, and this robotic system could be equipped with mirrors and optics to subsequently expose the component with a desired pattern of light. In step 130, the lithography machine projects a pattern of light onto the component via a mask or controlled light source. The resulting pattern of light exposes a portion of the ceramic slurry on the surface of the component, and solidifies the slurry in these regions into a ceramic layer. Unexposed portions of the ceramic slurry will remain liquified or viscous. The lithographic process may employ masks to obtain a projected pattern of light, or it may be a maskless process where no mask is used and the light source, possibly via one or more mirrors, creates the desired pattern on the component.

In step 140, the unexposed portions of the ceramic slurry or ceramic layer are removed by any suitable means (e.g., by washing or irrigating with a fluid). After removal, only the solidified and exposed portions of the ceramic layer will remain on the surface of the component. In step 150, a decision is made to repeat steps 110, 120, 130, 140 and/or 150, or not. The steps (or a portion thereof) may be repeated if additional ceramic layers are desired. Alternatively, if the desired number of ceramic layers have been obtained then the method can proceed to step 160.

After the desired number of steps 110-150 are completed, then a green or uncured ceramic layer is obtained. To cure and harden the resulting "green" ceramic layer the component is heated to sinter the component, in step 160. The component is heated to remove the binder and held at a desired elevated temperature for a predetermined time to obtain a desired density for the ceramic layer. After the heating process, a completed ceramic layer is ready for use.

Figure 2:
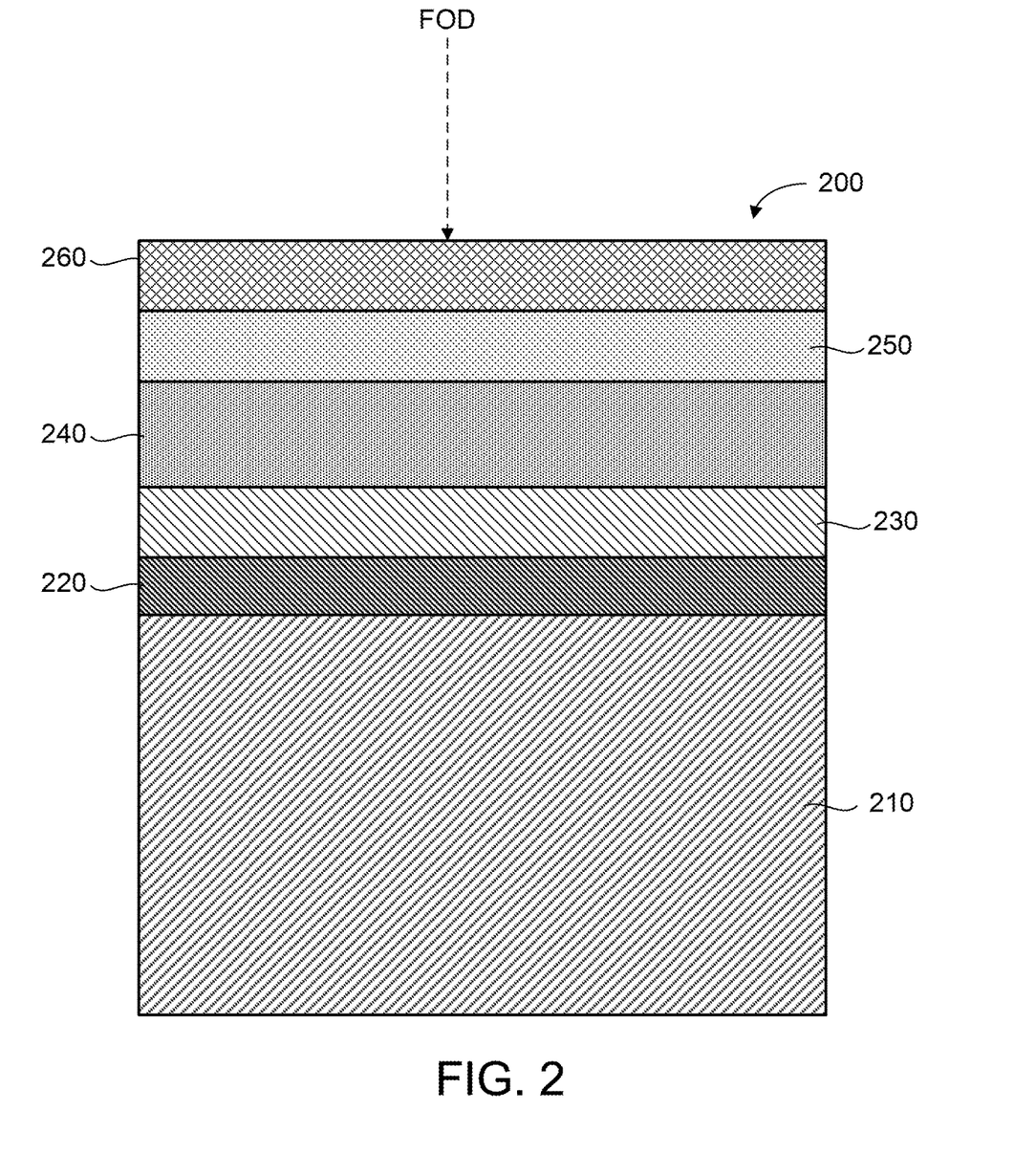
FIG. 2 illustrates a simplified and partial cross-sectional view of a component, according to an aspect of the present disclosure.
Figure 3:
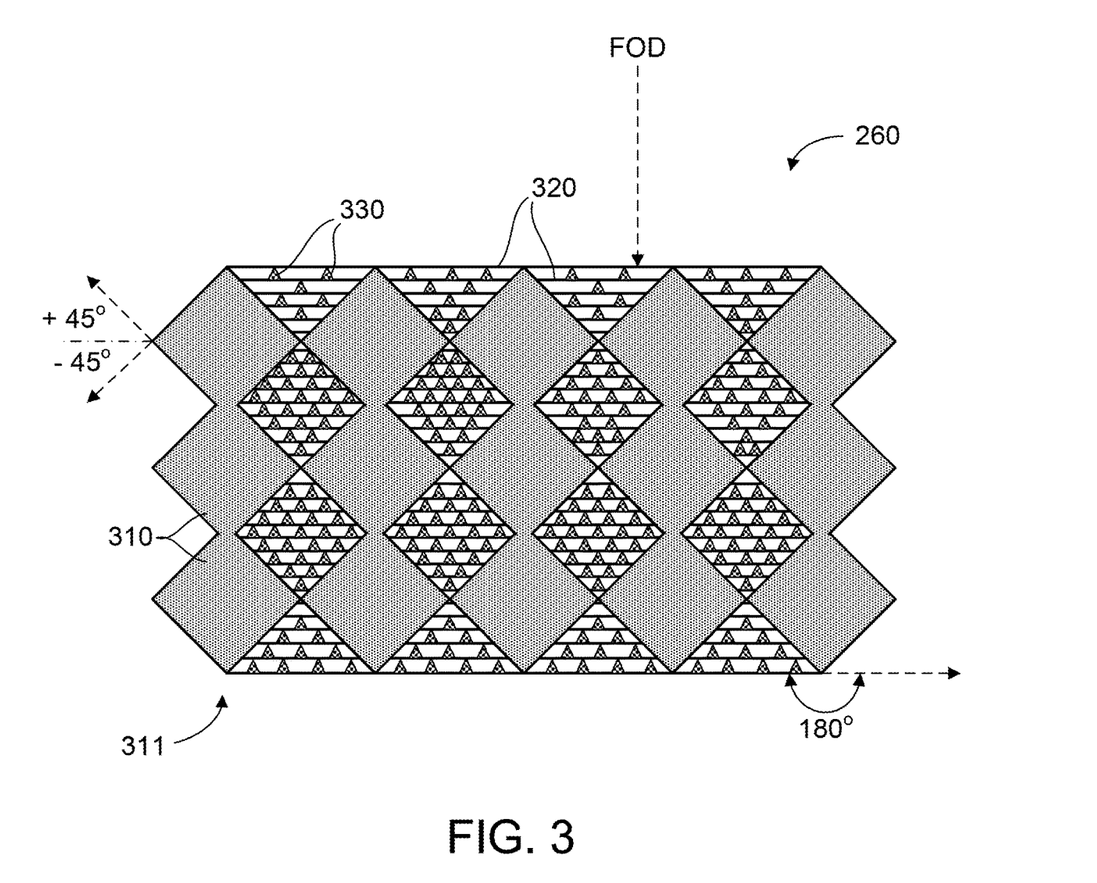
FIG. 3 illustrates an enlarged, partial cross-sectional view of the sacrificial layer, according to an aspect of the present disclosure.

FIG. 2 illustrates a simplified and partial cross-sectional view of a component 200, according to an aspect of the present disclosure. FIG. 3 illustrates a top view of the sacrificial layer 260, according to an aspect of the present disclosure. The component 200 is comprised of a plurality of layers having a defined macrostructure and microstructure. A base layer/material or substrate layer 210 may be formed of a superalloy material including nickel, cobalt, iron, or combinations thereof. For many gas turbine applications, such as turbine blades, vanes, shrouds and other components, the base layer 210 is a directionally solidified or single crystal nickel-based superalloy. An intermetallic or intermediate layer 220 may be deposited on the base layer or substrate 210.

Experience has shown that a ceramic insulation layer or TBC should not be deposited directly upon the metallic substrate 210 (in specific applications), in part because the adhesion between the two different materials is not sufficiently great, and in part because the difference in thermal expansion of the ceramic and metal causes the ceramic to crack and spall off during thermal cycling. That is, when the component 200 is heated and cooled as the turbine is turned on, operated at different power levels, and turned off, the difference in thermal expansion coefficients causes cracks to develop in the brittle ceramic. The cracks propagate through particular regions, and eventually flakes of the ceramic are separated from the substrate in the affected regions, a process known in the art as spalling. The exposed metallic substrate in those regions is then rapidly degraded by the hot gases. After spalling occurs in a region of a blade, its life before failure may be quite short.

In order to ensure good adhesion and to avoid spalling failures, the thermal barrier coating system includes a bond coating 230 and intermediate layer 220 between the TBC and the substrate 210. One preferred intermediate layer is an intermetallic nickel aluminide such as the compound NiAl or $Ni_2Al_3$, or a modified intermetallic compound such as NiAl—Cr. The intermediate layer 220 is deposited upon the substrate 210 by any acceptable deposition technique, for example pack cementation or physical vapor deposition. The intermediate layer 220 may be about 0.001 inches to about 0.005 inches thick, as deposited, or any other thickness as required in the specific application.

A bond coating 230 may be deposited on the intermediate layer 220. Suitable bond coats or coatings 230 include, but are not limited to, conventional diffusion coatings, such as nickel and platinum aluminides, MCrAlY coatings, etc. Aluminum-rich bond coats are known to develop an aluminum oxide (alumina) scale, which is grown by oxidation of the bond coat 230. The alumina scale chemically bonds a TBC to the bond coat 230 and substrate 210. The thickness of bond coating 230 may be of any suitable thickness for its intended application, as one skilled in the art would recognize, and the bond coating 230 may be omitted depending on the specific application.

A thermal barrier coating (TBC) 240 is deposited over one or more bond coat layers 230. Thermal barrier coating 240 may comprise any suitable ceramic material alone or in combination with other materials. For example, thermal barrier coating 240 may comprise fully or partially stabilized yttria-stabilized zirconia and the like, as well as other low conductivity oxide coating materials known in the art. Examples of other suitable ceramics include, but are not limited to, about 92-93 weight percent zirconia stabilized with about 7-8 weight percent yttria, among other known ceramic thermal barrier coatings, such as nonstabilized zirconia, zirconia partially or fully stabilized by one or more of calcia, magnesia, ceria, scandia, yttria, rare earth oxides or other oxides. The thermal barrier coating 240 may also comprise hafnia, zirconia or a mixture of hafnia and zirconia stabilized by one or more of yttria, scandia, magnesia, calcia, ceria and lanthanide series oxides.

The thermal barrier coating 240 may be applied by any suitable methods. One suitable method for deposition is by electron beam physical vapor deposition (EB-PVD), although plasma spray deposition processes, such as air plasma spray (APS), also may be employed for combustor application. The density of a suitable EB-PVD applied ceramic thermal barrier coating 240 may be about 4.7 g/cm$^3$, among other suitable densities. The thermal barrier coating 240 may be applied to any desired thickness and microstructure. For example, the coating 240 may have a thickness between about 75 micrometers and about 3,000 micrometers. The thickness may vary from location to location on a given part to, for example, provide the optimal level of cooling and balance of thermal stresses. An upper portion of the TBC 240 may also include a roughened or porous layer 250 formed of the same or similar material as layer 240. The roughened and/or porous nature of layer 250 facilitates bonding of a ceramic layer in the form of a sacrificial layer 260.

The sacrificial layer (or ceramic layer) 260 may be comprised of the same or similar materials as layers 240 and 250, or the sacrificial layer may be comprised of rare earth silicates. Suitable rare earth silicates include, but are not limited to, silicates of lanthanum, praseodymium, neodymium, promethium, samarium, europium, gadolinium, terbium, dysprosium, holmium, erbium, thulium, ytterbium, lutetium, scandium, yttrium and mixtures thereof. The rare earth silicate may be in the form of a monosilicate, $M_2SiO_5$, a disilicate, $M_2Si_2O_7$, or in combinations thereof. In addition, the monosilicate, disilicate or combinations may be deposited in combination with the rare earth oxide, $M_2O_3$. Alternatively, sacrificial layer 260 may be comprised of alumina, which can have a dense microstructure as a result of being deposited by a lithographic method. The function of the sacrificial layer 260 is to limit, reduce or eliminate foreign object damage to the underlying thermal barrier coating layers 240, 260. A suitable thickness for the sacrificial layer 260 may be between about 0.1 and about 200 micrometers. The sacrificial layer 260 is formed by the ceramic slurry and ceramic layers as described in conjunction with FIG. 1, and the method previously described.

The sacrificial layer 260 has microscopically and macroscopically weak points and fracture planes which allow for specific control over how the layer 260 fails when subjected to foreign object damage or impacts. The fracture planes are designed to limit foreign object damage by absorbing impact forces due to chemistry, microstructure, architecture, etc., and reducing net impacts and stresses on the underlying TBC layers 240, 250. For example, sacrificial layer 260 may have multiple, parallel and/or intersecting fracture planes defined by the surfaces thereof.

FIG. 3 illustrates an enlarged, partial and cross-sectional view of sacrificial layer (or ceramic layer) 260. The sacrificial layer is comprised of multiple elements that reduce foreign object damage to the underlying thermal barrier coating layer 240 and/or 250. Sacrificial layer 260 includes a plurality of macroscopic supporting members 310. The macroscopic supporting members 310 may be arranged in columns 311 and each macroscopic supporting member may be interlocked to a neighboring macroscopic supporting member in the vertical and/or horizontal direction (with respect to the view of FIG. 3). The macroscopic supporting members 310 may have a generally cubic, rectangular, diamond or polygonal shape. The macroscopic supporting members define fracture planes on the external surfaces thereof. For example, the fracture planes defined by macroscopic supporting members 310 are at +45 degrees and −45 degrees with respect to a surface of an underlying substrate layer. It is to be understood that angles greater or less than 45 degrees may also be used.

The intervening regions between columns 311 are populated with a plurality of parallel sheets 320 of ceramic material, and the sheets 320 are supported by intervening support elements 330. The sheets 320 define a plurality of fracture planes that are parallel to each other and to the surface of an underlying substrate layer. For example, the fracture planes defined by sheets 320 would be angled by 0 degrees or 180 degrees with respect to the underlying substrate layer. The supporting elements 330 are also formed of a ceramic material and may be generally triangular or pyramidal in shape. A foreign object impacting the parallel sheets 320 will absorb the impact forces of the impact and may flake off if the impact is sufficiently strong. For impacts on the sheets 320, the impact forces will be directed horizontally towards macroscopic supporting members 310, at which point in time the impact force will be directed at an angle of +/−45 degrees. The supporting elements 330 add strength to the ceramic layer 260 and sheets 320, and the spacing or location frequency of the supporting elements 330 may be varied based on location or depth in ceramic layer 260. As one example only, an upper layer of ceramic layer 260 may have a lower density of supporting elements 330 than a lower layer of ceramic layer 260, or vice-versa. Additionally, the multiple fracture planes may form angles of between about 10-80 degrees, 10-70 degrees, 10-60 degrees, 10-50 degrees, 10-40 degrees, 10-30 degrees, 20-89 degrees, 20-80 degrees, 30-80 degrees, 40-80 degrees, 50-80 degrees, 30-70 degrees, or 40-60 degrees with respect to a top surface of substrate 210. The angled fracture planes redirect the force of incoming foreign objects (illustrated by the dotted FOD line) to a more lateral direction so the force travels through more of the sacrificial layer 260 before reaching the underlying TBC layers. In addition, the force required to spall portions of the sacrificial layer 260 reduces the net force of FOD impacts that reach the TBC layers.

The lithographic process permits highly controlled deposition of the sacrificial layer so that very complex, multiple fracture plane containing and force absorbing shape configurations can be created for sacrificial/ceramic layer 260. Each fracture plane and each level of sacrificial layer 260 absorbs a portion of the total impact force, thereby protecting the underlying TBC layers 240, 250.

Figure 4:
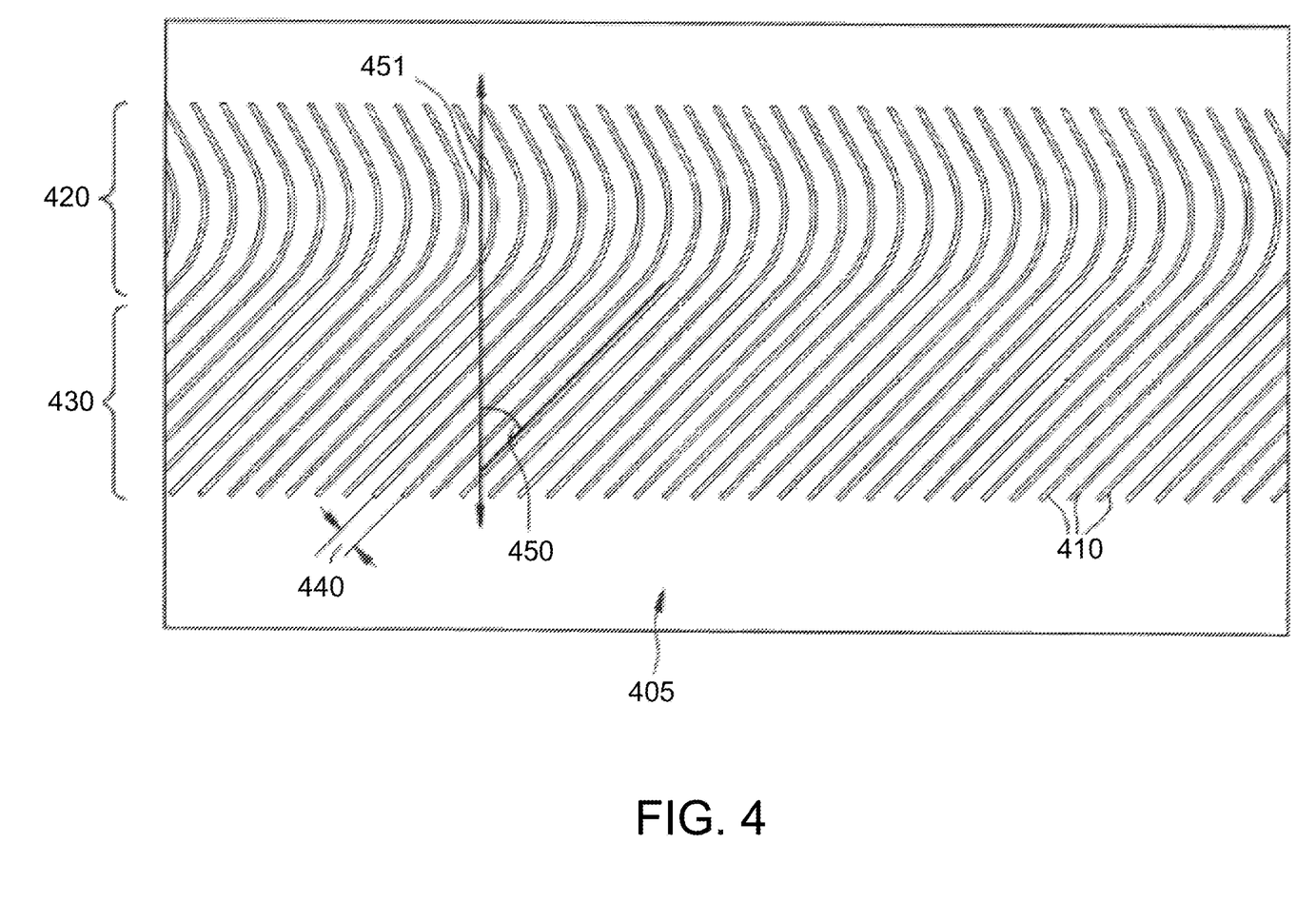
FIG. 4 illustrates a top view of a pattern for an abradable or sacrificial coating having a plurality of ridges, according to an aspect of the present disclosure.

FIG. 4 shows a view of an alternative exemplary embodiment of a pattern for an abradable or sacrificial coating 405 defining a plurality of ridges 410. The layer that forms the ridges 410 is formed by the ceramic slurry and ceramic layers as described in conjunction with FIG. 1, and the method previously described. The pattern 405 includes a curved section 420 and a straight section 430. The curved section 420 may be disposed at a portion of the pattern corresponding to the front portion of a turbine blade tip when the turbine blade tip is in abradable communication with the pattern. The straight section 430 is disposed at a portion of the ridges 410 corresponding to the back portion of the turbine blade tip when the turbine blade tip is in abradable communication with the pattern 405. The straight section 430 is at a first end of the ridges 410. The plurality of ridges 410 are disposed on the TBC layers 240, 250 such that each ridge 410 is substantially parallel to each other ridge 410 in the straight section 430. The pattern of ridges may also be on blade external surfaces locally. Each ridge 410 is also disposed such that there is an equal distance between contiguous ridges 410 in both the curved and the straight sections 420 and 430. A distance 440 between each ridge 410 may range between about 1 micrometer to about 14 mm, with a preferred distance 440 between each ridge 410 ranging between about 50 micrometers to about 7 mm. The portion of ridges 410 disposed in the straight section 430 such that an angle 450 is formed with respect to the reference line 451. The angle 450 ranges from about 20 degrees to about 70 degrees. The curved section 420 includes a radius configured to substantially match a mean camber line shape through the curved section 420. An advantage of lithographically printing ridges 410 is that no (or at least very minimal) machining is required and the lack of machining extends the component's lifetime by eliminating (or reducing) residual stress that would have been caused by the machining process. The ridges may take any desired configuration, for example, the ridges 410 may be straight, curved, curvilinear, angled to one side or the other, or tapered in width along a radial direction (with respect to the turbomachine). One non-limiting example of a component making use of ridges 410 is a shroud configured for use in a gas turbine.

Figure 5:
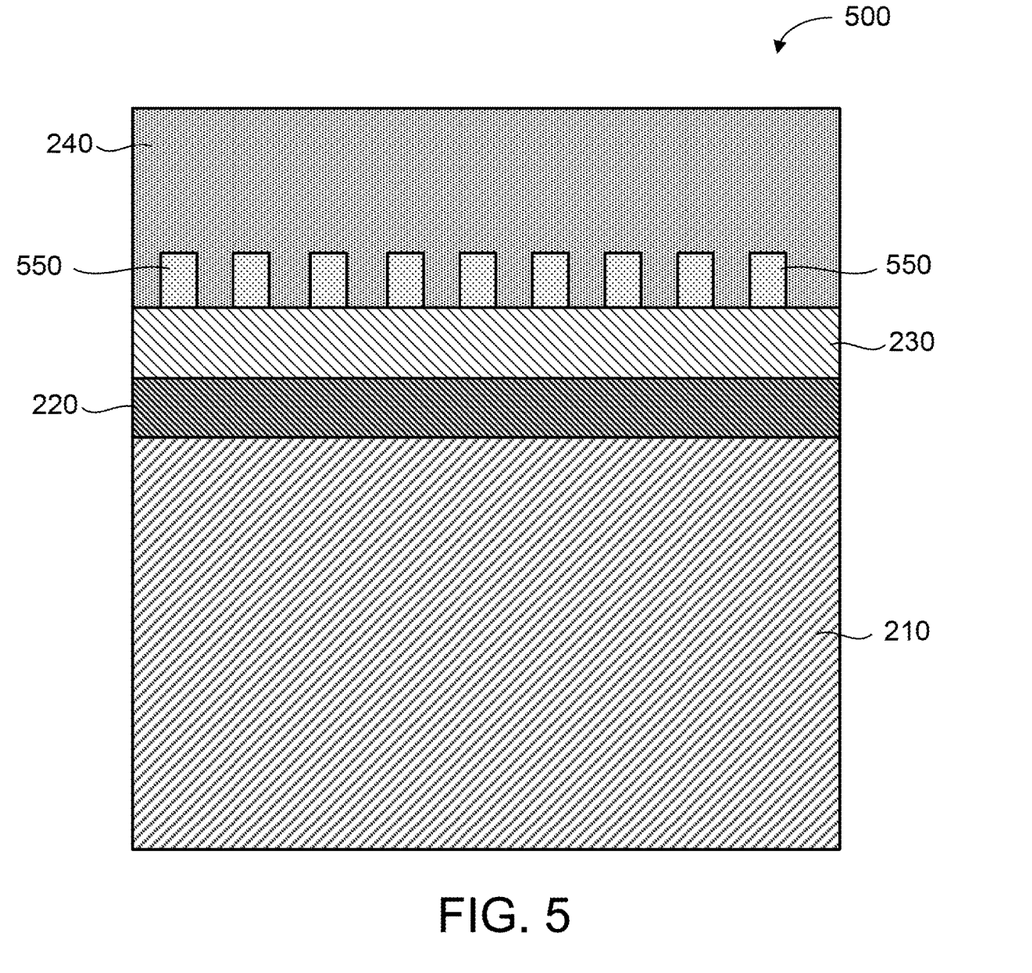
FIG. 5 illustrates a simplified and partial cross-sectional view of a component, according to an aspect of the present disclosure.

FIG. 5 illustrates a simplified and partial cross-sectional view of a component 500, according to an aspect of the present disclosure. The component 500 is comprised of a plurality of layers. A base layer/material or substrate layer 210 may be formed of a superalloy material including nickel, cobalt, iron, or combinations thereof. For many gas turbine applications, such as turbine blades, vanes, shrouds and other components, the base layer 210 is a directionally solidified or single crystal nickel-based superalloy. An intermetallic or intermediate layer 220 may be deposited on the base layer or substrate 210.

In order to ensure good adhesion and to avoid spalling failures, the thermal barrier coating system includes a bond coating 230 and intermediate layer 220 between the thermal barrier coating 240 and the substrate 210. The intermediate layer 220 is deposited upon the substrate 210 by any acceptable deposition technique, for example pack cementation or physical vapor deposition. A bond coating 230 is deposited on the intermediate layer 220. Suitable bond coats or coatings 230 include, but are not limited to, conventional diffusion coatings, such as nickel and platinum aluminides, MCrAlY coatings, etc.

In the past, metallic anchoring structures have been added to bond coats to help the ceramic coating better adhere to the bond coat. However, the metal materials used for these anchoring structures limit the maximum allowable temperature during operation, as metals melt and fail at lower temperatures than ceramics. The method described in conjunction with FIG. 1 can be used to lithographically print a plurality of stress raising elements 250 or anchoring structures on the bond coating 230. The ceramic slurry and resulting ceramic layers (which form stress raising elements 550) lithographically printed can be of the same or similar ceramic materials as TBC layer 240, thereby exhibiting improved temperature performance in comparison to metallic structures. The stress raising elements 250 (which can also be a metal-ceramic composite) are configured and located to encourage the TBC layer 240 to crack in desired locations and along desired fracture planes, thereby reducing failure of TBC coating 240. For example, the shapes, locations, sizes and heights of the stress raising elements 550 can be individually tailored to provide a natural tendency in the TBC coating to fracture where desired. The shape of stress raising elements 550 may be rectangular (as shown) or may be trapezoidal with the larger dimension near the top (in FIG. 5) of the stress raising element. This forms a "dovetail shape" that keys the TBC coating 240 to component 500.

After the stress raising elements 250 are lithographically deposited, a thermal barrier coating (TBC) 240 is deposited over bond coating layer 230 and stress raising elements 550. Thermal barrier coating 240 may comprise any suitable ceramic material alone or in combination with other materials, as discussed above. The lithographic process permits highly controlled deposition of the stress raising elements 550 so that very complex and force guiding shape configurations can be created. For example, a first group of stress raising elements 550 can be designed to have a greater height (or thickness) than a second group of stress raising elements. Furthermore, the method herein described may be performed on a component to repair damage (e.g., FOD or erosion damage) to the component or to increase the lifespan of the component. The ceramic layer may be applied locally to only locations on the component known to be prone to foreign object damage or erosion, or the ceramic layer can be applied to the entire surface of the component.

In addition, while the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. A method for protecting a coating on a surface of a component, the method comprising the steps of:
    coating at least a portion of the component with a ceramic slurry;
    projecting a pattern of light onto the component with a lithographic process to expose and solidify a ceramic layer;
    removing unexposed portions of the ceramic slurry from the component;
    heating the component to sinter the ceramic layer; and
    wherein the ceramic layer is formed with multiple fracture planes, the ceramic layer further including a plurality of macroscopic supporting members, each of the plurality of macroscopic supporting members having a generally cubic or diamond shape.

2. The method of claim 1, further comprising:
    repeating the coating, the projecting and the removing steps until a desired number of ceramic layers is obtained.

3. The method of claim 1, wherein the ceramic layer is formed with multiple parallel fracture planes.

4. The method of claim 1, wherein the ceramic layer is formed with the macroscopic supporting members including a plurality of microscopic weak points and macroscopic weak points.

5. The method of claim 1, wherein the multiple fracture planes are formed by a plurality of parallel sheets of ceramic material.

6. The method of claim 1, wherein the parallel sheets are spaced and at least partially supported by a plurality of support elements.

7. The method of claim 1, wherein the plurality of macroscopic supporting members are arranged in columns forming an interlocking stack of macroscopic supporting members.

8. The method of claim 7, wherein intervening regions between the columns are populated with a plurality of parallel sheets of ceramic material.

9. The method of claim 8, wherein the parallel sheets are spaced and at least partially supported by a plurality of support elements.

10. The method of claim 1, wherein at least a portion of the fracture planes form an angle with an underlying substrate layer of between 10 degrees and less than 90 degrees.

11. The method of claim 1, wherein at least a portion of the fracture planes are parallel to an underlying substrate layer.

12. The method of claim 1, wherein a first portion of the fracture planes form an angle with an underlying substrate layer of between 10 degrees and less than 90 degrees, and a second portion of the fracture planes are parallel to an underlying substrate layer.

13. The method of claim 1, wherein the component is a blade, nozzle, combustor, transition piece or a shroud configured for use with a gas turbine.

14. The method of claim 1, wherein the lithographic process includes photolithography.

15. The method of claim 1, wherein the ceramic slurry comprises at least one of:
zirconia, alumina, silica, carbides, nitrides, silicates, or combinations thereof.

16. The method of claim 1, wherein the method is performed on a component to repair damage to the component or to increase the lifespan of the component.

* * * * *